(12) United States Patent
Bazin et al.

(10) Patent No.: US 11,217,823 B2
(45) Date of Patent: Jan. 4, 2022

(54) METHOD FOR FABRICATING AN ELECTROCHEMICAL DEVICE AND ELECTROCHEMICAL DEVICE

(71) Applicant: COMMISSARIAT A L'ENERGIE ATOMIQUE ET AUX ENERGIES ALTERNATIVES, Paris (FR)

(72) Inventors: Arnaud Bazin, Fontaine (FR); Sami Oukassi, Saint-Egreve (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 289 days.

(21) Appl. No.: 16/334,483

(22) PCT Filed: Sep. 18, 2017

(86) PCT No.: PCT/FR2017/052494
§ 371 (c)(1),
(2) Date: Mar. 19, 2019

(87) PCT Pub. No.: WO2018/051045
PCT Pub. Date: Mar. 22, 2018

(65) Prior Publication Data
US 2019/0214679 A1    Jul. 11, 2019

(30) Foreign Application Priority Data

Sep. 19, 2016 (FR) ...................... 1658776

(51) Int. Cl.
*H01M 10/0565* (2010.01)
*H01M 6/22* (2006.01)
(Continued)

(52) U.S. Cl.
CPC ........ *H01M 10/0565* (2013.01); *H01L 31/00* (2013.01); *H01M 6/40* (2013.01);
(Continued)

(58) Field of Classification Search
None
See application file for complete search history.

(56) References Cited

U.S. PATENT DOCUMENTS 5,426,005 A    6/1995   Eschbach
6,576,371 B1 * 6/2003   Yasuda ............. H01M 10/0565
                                             429/309
(Continued)

FOREIGN PATENT DOCUMENTS

WO    00/25378 A1    5/2000
WO    00/38263 A1    6/2000

OTHER PUBLICATIONS

Nov. 14, 2017 International Search Report issued in International Patent Application No. PCT/FR2017/052494.
(Continued)

*Primary Examiner* — Tracy M Dove
(74) *Attorney, Agent, or Firm* — Oliff PLC

(57) ABSTRACT

The method for fabricating an electrochemical device includes the following successive steps: a first stack successively including a first electrode and an electrically insulating electrolyte having a first main surface in contact with the first electrode and an opposite second main surface; a polymerisation step of the electrolyte so as to define at least a first area presenting a first degree of cross-linking and a first cross-linking density and a second area presenting a second degree of cross-linking different from the first degree of cross-linking and/or a second cross-linking density different from the first cross-linking density, said at least first and second areas connecting the first main surface with the second main surface; and placing the second electrode in contact with the electrolyte.

17 Claims, 7 Drawing Sheets

(51) Int. Cl.
  *H01L 31/00*    (2006.01)
  *H01M 10/052*   (2010.01)
  *H01M 6/40*     (2006.01)
  *H01M 10/04*    (2006.01)
  *H01M 10/0525*  (2010.01)
  *H01M 10/054*   (2010.01)

(52) U.S. Cl.
  CPC ......... *H01M 10/04* (2013.01); *H01M 10/052* (2013.01); *H01M 10/0525* (2013.01); *H01M 6/22* (2013.01); *H01M 10/054* (2013.01); *H01M 2010/0495* (2013.01); *H01M 2300/0085* (2013.01)

(56) References Cited

U.S. PATENT DOCUMENTS

| | | |
|---|---|---|
| 8,420,701 B2 | 4/2013 | Kinoshita |
| 2004/0106236 A1 | 6/2004 | Hu et al. |
| 2012/0315547 A1* | 12/2012 | Itoh .................. C08L 71/02 429/312 |
| 2014/0162172 A1* | 6/2014 | Takezawa .......... H01M 8/1072 429/492 |
| 2015/0072245 A1 | 3/2015 | Yu et al. |
| 2015/0133570 A1* | 5/2015 | Shin .................... C08J 3/24 521/27 |

OTHER PUBLICATIONS

Mar. 19, 2019 International Preliminary Report on Patentability issued in International Patent Application No. PCT/FR2017/052494.

\* cited by examiner

METHOD FOR FABRICATING AN ELECTROCHEMICAL DEVICE AND ELECTROCHEMICAL DEVICE

FIELD OF THE INVENTION

The invention relates to a method for fabricating an electrochemical device. The invention also relates to an electrochemical device.

STATE OF THE ART

Microbatteries are defined as being electrochemical generators formed by a stack of thin layers comprising at least two (positive and negative) electrodes separated by an electrolyte. These microbatteries in particular enable power sources to be tailored to accommodate the new mobile applications that are regularly proposed and that integrate electronic microcircuits.

A large number of electrochemical devices, and in particular batteries, use an electrolyte in liquid form. This electrolyte is composed of a solvent associated with a metallic salt. This electrolyte presents a high conductivity, greater than $10^{-3}$ S/cm, which makes it particularly advantageous. However, devices using a liquid electrolyte are subjected to stringent safety constraints as the risk of leakage of the electrolyte is non-negligible.

It is known to use totally solid electrolytes that are fabricated using polymers. Totally solid electrolytes use a metallic salt associated with a polymer or inorganic matrix. These electrolytes do not contain any solvents. They are characterised by a good mechanical strength and by a low ionic conductivity, typically less than $10^{-6}$ S/cm. As the electrolyte is in solid form, there is no risk of leakage.

Work is ongoing to improve the performances of electrolytes and in particular the ionic conductivity. An exemplary embodiment is described in the document WO00/38263 which presents the use of a microporous solid electrolyte. The porous electrolyte film is fabricated in different ways and a liquid electrolyte is added. The liquid electrolyte is injected into the porous film. This embodiment enables the ionic conductivity performances to be improved by means of the liquid electrolyte as compared with the totally solid electrolyte. It is however apparent that the mechanical performances of the microporous electrolyte are not satisfactory. It is also apparent that the safety problems related to leakage of the liquid electrolyte remain partially unsolved.

It is also known to use polymer-gel electrolytes. These electrolytes use a polymer or inorganic matrix that is used to confine a liquid. This liquid is formed by mixing a solvent with a metallic salt. The polymer matrix provides the mechanical properties and the liquid phase provides the electrochemical properties. Such an electrolyte presents improved electrochemical performances in comparison with a totally solid electrolyte made from polymers. However, the electrochemical performances and in particular the ionic conductivity are not as good as those of a liquid electrolyte. It is also apparent that implementation is more complicated.

Work has been carried out to increase the ionic conductivity and more particularly the ionic conductivity at low temperature. The document US 2004/0106236 presents an embodiment where the solid electrolyte is divided into two distinct layers having different mechanical and electrolytic performances.

A first electrolyte layer is located on the cathode side and this layer provides the mechanical performances of the electrolyte. A second electrolyte layer is located on the anode side and this layer provides the electrolytic performances. This second electrolyte layer ensures transmission of the lithium ions between the anode and the cathode.

Here again, it is apparent that the ionic conductivity performances of the electrolyte layer as a whole are unsatisfactory.

Another solution has further been proposed in the document U.S. Pat. No. 8,420,701. This document proposes to fabricate a two-material electrolyte layer. The electrolyte layer is formed by a perforated film which is filled with an ion exchange resin. It is apparent that this solution does not give satisfaction from the ionic conduction and implementation standpoint.

OBJECT OF THE INVENTION

The object of the invention is to provide a method for fabricating an electrochemical device that is easy to implement and that enables a device to be produced with an electrolyte that globally presents improved performances.

The method for fabricating the electrochemical device is remarkable in that it comprises the following steps:
  providing a first electrode,
  providing a second electrode,
  providing an electronically insulating and ionically conducting electrolyte, the electrolyte presenting an initial degree of cross-linking and an initial cross-linking density, the electrolyte being at least in contact with the first electrode,
  performing a polymerisation step of the electrolyte so as to define at least one polymerisation area presenting a first degree of cross-linking and a first cross-linking density and a second polymerisation area presenting a second degree of cross-linking different from the first degree of cross-linking and/or a second cross-linking density different from the first cross-linking density, the first and second degrees of cross-linking being higher than the initial degree of cross-linking and the first and second cross-linking densities being higher than the initial cross-linking density.

In one development, the polymerisation step defines an alternation of first polymerisation areas and second polymerisation areas in a direction parallel to the first main surface of the electrolyte.

In advantageous manner, the polymerisation step is a polymerisation step by exposure by means of at least one electromagnetic radiation.

Preferentially, an electromagnetic radiation source is configured to emit a first electromagnetic radiation power to form the first polymerisation area and the second polymerisation area.

As an alternative, the electromagnetic radiation source is configured to simultaneously emit a first electromagnetic radiation power to form the first polymerisation area and a second electromagnetic radiation power different from the first power to form the second polymerisation area.

It is advantageous to provide for the polymerisation step to comprise an exposure step through a mask presenting at least two regions presenting different transmission rates at said at least one electromagnetic radiation to form said at least first and second polymerisation areas.

In a particular embodiment, the at least two regions of the mask are configured to allow said at least one electromagnetic radiation to pass.

Advantageously, the method comprises a single exposure step configured to form said at least first and second polymerisation areas.

In a preferential embodiment, the exposure time to the electromagnetic radiation is identical to form said at least first and second polymerisation areas.

It is advantageous to provide for the exposure times to the electromagnetic radiation to be different to form said at least first and second polymerisation areas.

In another development, before the polymerisation step, the electrolyte is in liquid form and the polymerisation step is configured to form at least one of the polymerisation areas in solid or gel form and to keep the other of the polymerisation areas in liquid form.

In advantageous manner, before the polymerisation step, the electrolyte is in liquid form and the polymerisation step is configured to form a first polymerisation area in solid or gel form and a second polymerisation area in solid or gel form.

In a preferential embodiment, the electrochemical device is a battery or an electrochrome device and the first electrode comprises:
- a first support substrate,
- a first current collector covering the first support substrate,
- a first electrochemically active layer in electric contact with the first current collector.

The electrolyte is in contact with the first electrochemically active layer and the second electrode comprises:
- a second electrochemically active layer separated from the first electrochemically active layer by the electrolyte,
- a second current collector in contact with the second electrochemically active layer, the second current collector being separated from the first current collector by the electrolyte,
- a second support substrate.

Advantageously, polymerisation of the electrolyte is performed by means of an ultraviolet radiation.

In a preferential embodiment, the second electrode is placed in contact with the electrolyte, before the polymerisation step.

In another embodiment, the second electrode is placed in contact with the electrolyte, after the polymerisation step.

It is further object of the invention to provide an electrochemical device presenting enhanced performances.

The electrochemical device is remarkable in that it comprises a first electrode and a second electrode separated by an electrically insulating electrolyte. The electrolyte comprises a first polymerisation area presenting a first degree of cross-linking and a first cross-linking density and a second polymerisation area presenting a second degree of cross-linking different from the first degree of cross-linking and/or a second cross-linking density different from the first cross-linking density. Said at least first and second areas connect the first electrode with the second electrode and the first polymerisation area and the second polymerisation area are formed by a solid electrolyte containing a polymer. The first polymerisation area is formed by a first mixture having the first degree of cross-linking and the first cross-linking density and the second polymerisation area is formed by the first mixture having the second degree of cross-linking and the second cross-linking density.

BRIEF DESCRIPTION OF THE DRAWINGS

Other advantages and features will become more clearly apparent from the following description of particular embodiments of the invention given for non-restrictive example purposes only and represented in the appended drawings, in which.

DETAILED DESCRIPTION

Figure 1:
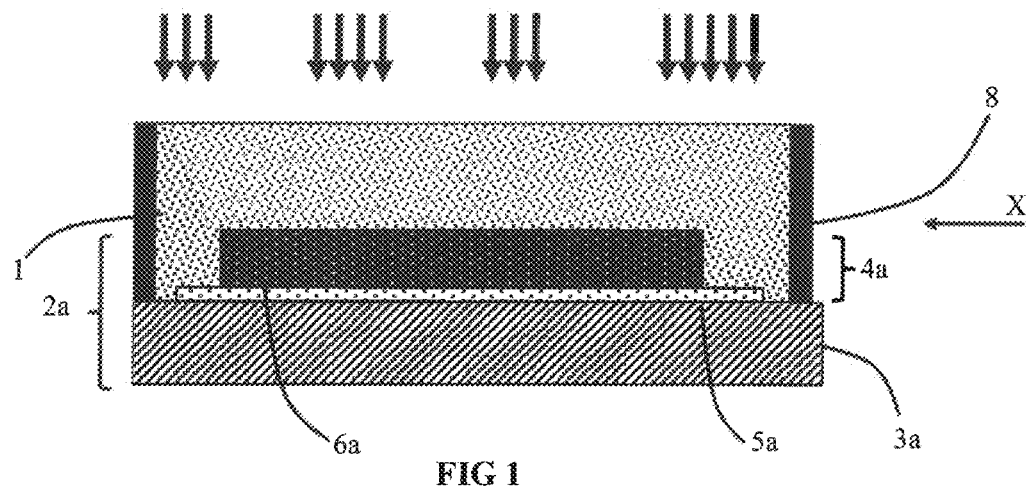
FIGS. 1 to 5 represent, in schematic manner, four alternative embodiments of a method for fabricating an electrochemical device, in cross-section.

The method comprises provision of a first stack comprising a first electrode 2a covered by an electrolyte 1 for the purposes of forming an electrochemical device such as the one illustrated in FIG. 1.

Figure 11:
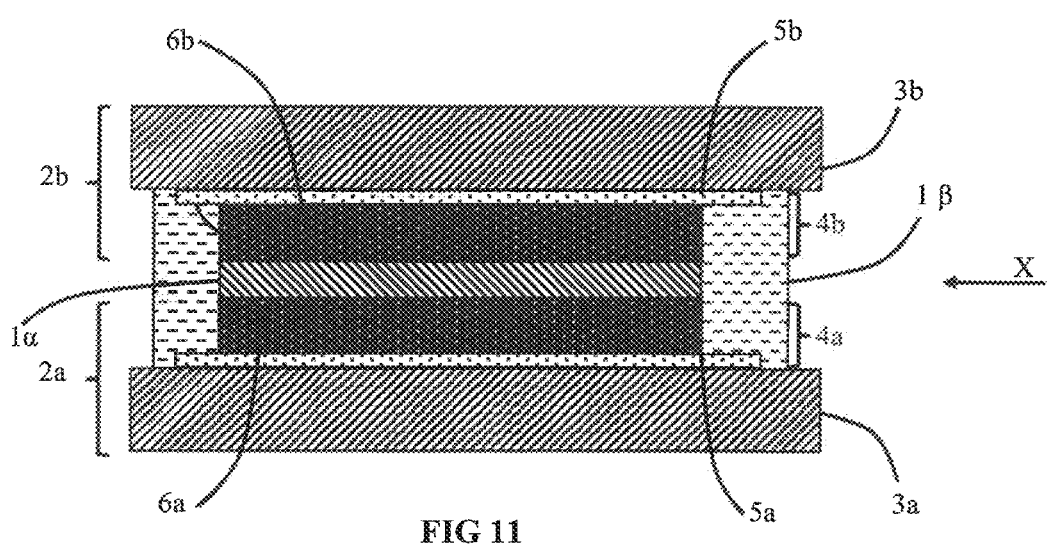
Figure 12:
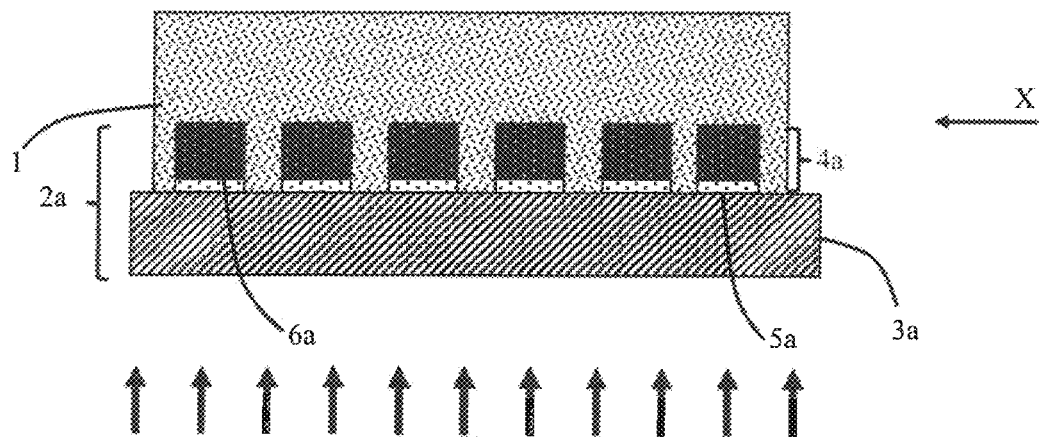
FIGS. 12, 13 and 14 represent, in schematic manner, another embodiment of a method for fabricating an electrochemical device, in cross-section.
Figure 13:
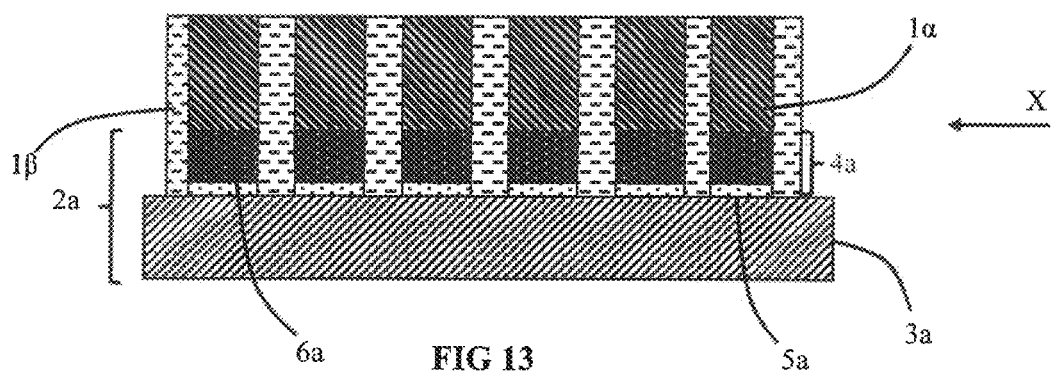
Figure 14:
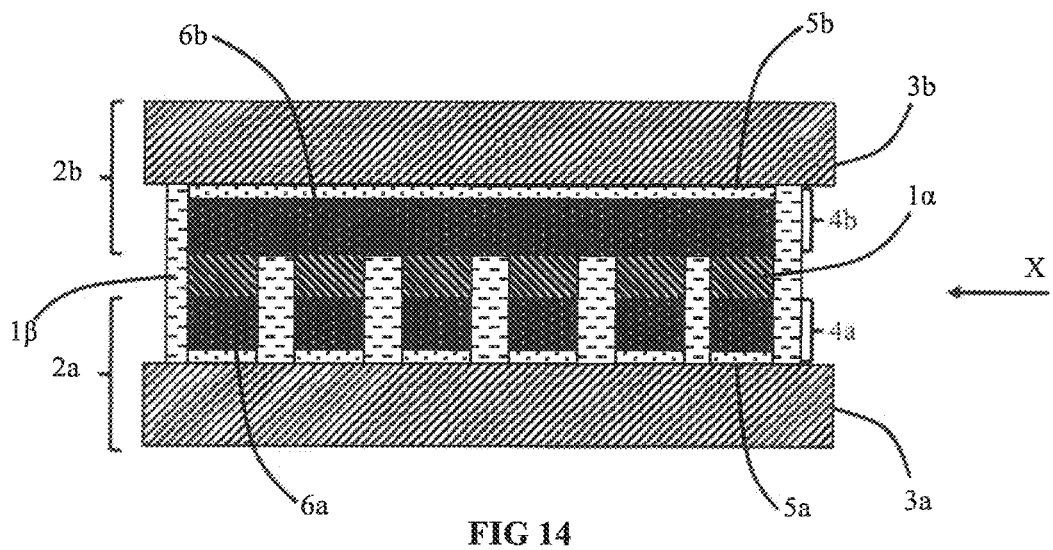
Figure 15:
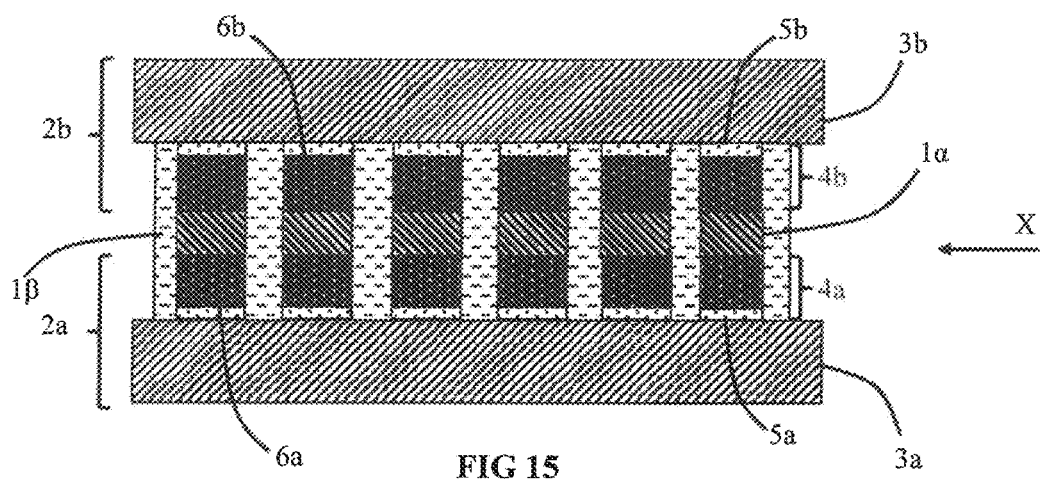
FIG. 15 represents, in schematic manner, an alternative embodiment to the method for fabricating illustrated in FIG. 14, in cross-section.

As illustrated in FIG. 11, for example purposes, the electrochemical device comprises an electrolyte 1 which physically and electrically separates first and second electrodes 2a and 2b. The first and second electrodes 2a and 2b are distinct from one another and electrically conducting.

Depending on the embodiments, the electrochemical device can for example be: a battery and more particularly a microbattery, an electrochrome device, or a capacitor and more particularly a supercapacitor.

In a first embodiment, at least one of the first and second electrodes 2a and 2b provides the mechanical support of the electrochemical device. In one embodiment, the first electrode 2a performs the support function and the second electrode 2b acts as a cover to seal off the electrochemical device. In an alternative embodiment, the first electrode 2a and second electrode 2b both perform the mechanical support function.

In advantageous manner, the first and second electrodes 2a and 2b present barrier characteristics. Preferably, in the case of a battery or an electrochrome device, the first and second electrodes 2a and 2b form a diffusion barrier preventing pollutants such as $O_2$ or $H_2O$ from penetrating into the electrochemical device.

Figure 16:
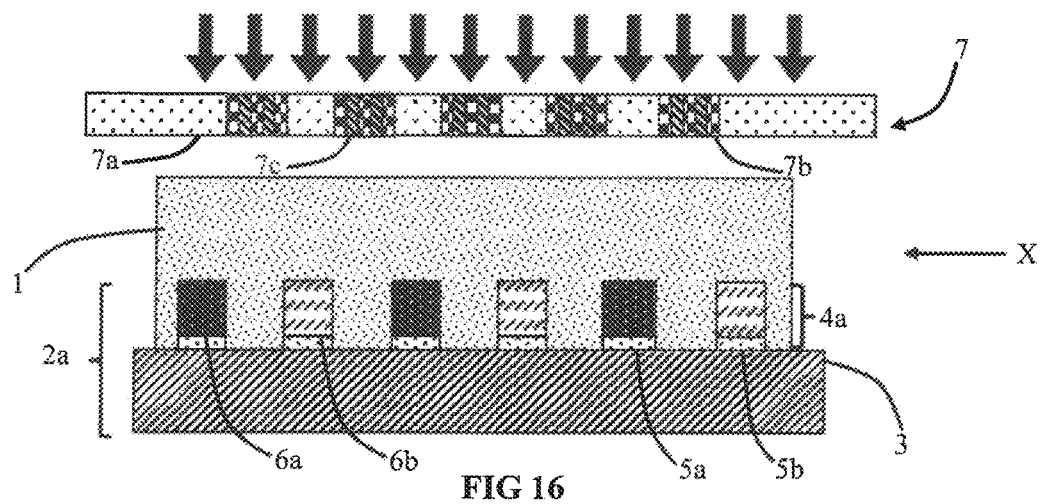
FIGS. 16 and 17 illustrate another embodiment where the two electrodes are formed on a single support substrate.

In another embodiment illustrated in FIG. 16, the first and second electrodes 2a and 2b are formed on one and the same support substrate 3.

In a first particular embodiment, the first and/or second electrodes 2a and 2b are fabricated exclusively from electrically conducting materials. The first electrode 2a and second electrode 2b can be made from identical or different materials. The first electrode 2a and second electrode 2b can be made entirely from a metal. The metal can be a pure element or a metal alloy. The pure element or the constituents of the alloy can be chosen from the following elements: aluminium, copper, nickel, titanium, silver, gold, chromium, tungsten, tantalum, barium and platinum. It is also possible to fabricate the first electrode 2a and/or second electrode 2b from an alloy containing at least two of the foregoing materials.

The first electrode 2a and/or second electrode 2b can have flat or three-dimensional main surfaces, i.e. that comprise salient and/or recessed areas. The flat or three-dimensional main surfaces are the two surfaces facing one another and in contact with the electrolyte 1.

In an alternative embodiment illustrated in FIGS. 1, 2 and 9 to 15, the first and/or second electrodes 2a and 2b are formed by stacks of several different layers. These stacks advantageously comprise a first support substrate 3a and a second support substrate 3b made from electrically insulating material. The first support substrate 3a and second support substrate 3b are respectively covered by a first electrically conducting layer 4a and a second electrically conducting layer 4b.

In a particular embodiment, the first support substrate 3a and/or second support substrate 3b can be made from identical or different materials. The support substrate 3a/3b can for example be made from silicon, glass, quartz, mica, silicates, ceramic material and/or plastic material. It is advantageous to fabricate the support substrate 3a/3b from a plastic material chosen from the polyimide which can be sold under the tradename Kapton® or polyethylene terephtalate which can be sold under the tradename Mylar®.

Figure 17:
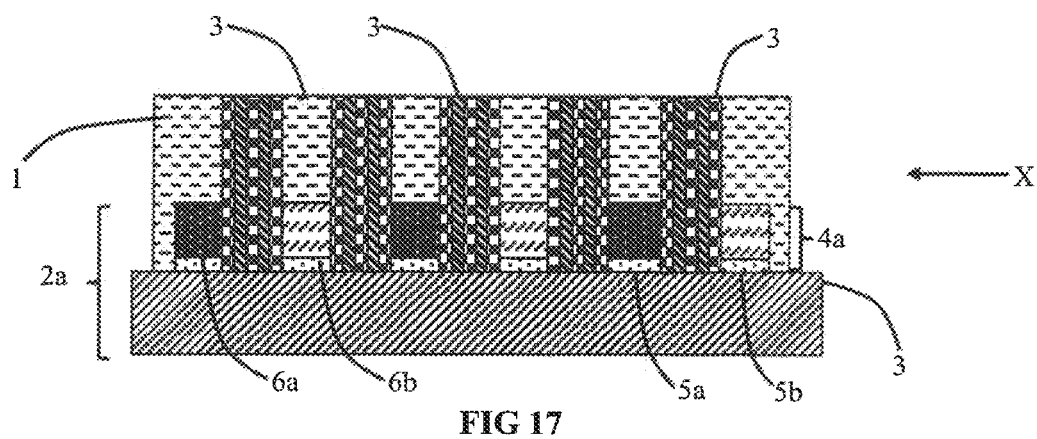

In an alternative embodiment illustrated in FIGS. 16 and 17, the first electrode 2a and second electrode 2b share the same support substrate 3. The support substrate 3 is electrically insulating and can be made from the materials listed above.

Depending on the embodiments, the first and second electrodes 2a and 2b are in contact with two opposite main surfaces of the electrolyte layer 1 or they are in contact with one of the main surfaces of the electrolyte layer 1 only.

The first electrically conducting layer 4a and/or second electrically conducting layer 4b can be made from identical or different materials. The electrically conducting layer 4a/4b can be made from one of the electrically conducting materials listed above to form the electrodes 2a/2b.

In an advantageous embodiment, the first electrically conducting layer 4a and/or second electrically conducting layer 4b respectively comprise a first current collector 5a covered by a first electrochemically active layer 6a and a second current collector 5b covered by a second electrochemically active layer 6b.

The first electrochemically active layer 6a and/or second electrochemically active layer 6b advantageously present common electrochemical properties with the electrolyte 1.

The current collector 5a/5b is made from an electric current conducting material. The current collector 5a/5b can be made from any one of the different materials proposed to form the electrodes 2a/2b. The first current collector 5a can be made from a material that is identical to or different from that of the second current collector 5b. In advantageous manner, the current collector is made from metal and comprises an atomic percentage of at least 90% of one of the above metals. It is also possible to fabricate the current collectors from a metal alloy made from one or more of the materials listed above.

The first electrochemically active layer 6a and second electrochemically active layer 6b can be made from identical or different materials. It is advantageous to use the first electrochemically active layer 6a and/or second electrochemically active layer 6b to form a battery or an electrochrome device.

The first electrochemically active layer 6a or the second electrochemically active layer 6b forms a positive electrode. The positive electrode is a cation insertion electrode to insert $Na^+$ or $Li^+$ for example. To form the positive electrode, it is possible to use lithium intercalation materials and for example those of the LiMO group and more particularly: $LiCoO_2$, $LiFeO_2$, $LiNiO_2$, $LiMn_2O_4$, $Li_{0.33}MnO_2$ and more generally materials of $LiM_xMn_{2-x}O_4$ type with $0 \leq x \leq 0.5$ and M=Ni, Co, Fe, Ti etc. It is further possible to fabricate the positive electrode from a material chosen from $LiCoPO_4$, $LiFePO_4$, $Li_4Ti_5O_{12}$, or LiTiOS.

The same can be the case for sodium and in general manner for the ion used in operation of the electrochrome device or of the battery.

The other electrochemically active layer 6b or 6a is a negative electrode. The material used to form the negative electrode depends on the type of battery involved, i.e. on the type of electrolyte 1 used. The battery can be a lithium-metal battery with a lithium-metal electrode.

The negative electrode can also be of lithium-ion type with materials able to form an alloy or a defined compound with lithium. The materials forming the electrochemically active layer 6a/6b are advantageously chosen from the list composed of: Bi, Sb, Si, Sn, Zn, Ni, Cd, Ce, Co, Fe, Mg, and Ge. It is also possible to choose oxides of $M_xO_y$ type or sulphides of $M_xS_y$ type with M representing a metal. It is further possible to fabricate the electrode by means of a complex of MF or MF2 type with M representing a metal and F representing fluorine.

It is further possible to fabricate a battery of lithium-free type. In this case, one of the electrochemically active layers 6a or 6b is present. The negative electrode can be made from a non-electrochemically active material, for example from a material able to form a current collector, for example copper. The same can be the case for sodium-based batteries.

This embodiment is particularly advantageous when the first and/or second current collectors 5a and 5b do not present any electrochemical properties and/or are not electrochemically active and even more advantageously when the first and/or second current collectors 5a and 5b present a better electric conductivity than the first or second electrochemically active layers 6a or 6b.

As an alternative, it is also possible to fabricate the electrically conducting layer 4a/4b from a material presenting electrochemical properties and/or being electrochemically active and chosen from the materials presented above to form the layers 6a/6b.

These properties are particularly desirable for formation of a microbattery and of an electrochrome device.

As indicated in the foregoing, the electrolyte layer 1 separates the two electrodes 2a and 2b and, more precisely, the electrolyte layer 1 separates the first and second support substrates 3a and 3b and the first and second electrically conducting layers 4a and 4b.

In certain embodiments, it is also provided for the electrolyte layer 1 to separate the first and second current collectors 5a and 5b and the first and second electrochemically active layers 6a and 6b.

In order to produce a more rugged electrochemical device, it is particularly advantageous to use an electrolyte 1 that is at least partially in the form of a solid or a gel enabling risks of leakage to be limited. However, the use of an electrolyte in solid or gel form generally results in a more complex fabrication method and interface problems, mainly between the electrodes 2a and/or 2b and the electrolyte 1.

In order to ensure a good contact between the electrodes 2a and 2b, the electrolyte 1 is initially in liquid or gel form which enables it to adjust to the different morphologies of the surface of the electrode 2a/2b. When the electrode comprises gaps and/or a porous material, the use of a liquid electrolyte or an electrolyte in the form of a low-viscosity gel enables the latter to penetrate into the gaps, for example the pores of the electrode. This ensures that each of the electrodes is well impregnated with electrolyte 1. This configuration is particularly advantageous when at least one of the electrodes 2a/2b is three-dimensional, i.e. comprising a salient part. The electrolyte can then infiltrate into the anfractuosities of the material which is not the case with a solid or highly viscous electrolyte.

The electrolyte 1 is configured to be able to be polymerised thereby increasing its degree of cross-linking and/or its cross-linking density. The electrolyte 1 can be transformed into a solid electrolyte or a gel. Before the polymerisation step, the electrolyte 1 presents an initial degree of cross-linking and an initial cross-linking density. As indicated in the foregoing, when the polymerisation step is performed, the first and second electrodes 2a and 2b are in contact with the electrolyte 1. As an alternative, the first electrode is in contact with the electrolyte 1 when polymerisation is performed, and the second electrode 2b is placed in contact with the electrolyte 1 at a later stage.

A polymerisation step is performed with the electrolyte 1 in contact with the first electrode 2a. In this way, the polymerised electrolyte will remain perfectly in contact with the electrode 2a. This embodiment is preferable to an embodiment where the electrolyte is already cross-linked before being connected with the first electrode 2a. As the electrolyte is malleable, it can deform to partially compensate uncertainties of fabrication and to ensure a perfect contact with the first electrode 2a before being polymerised.

This solution is particularly advantageous when fabricating a battery or an electrochemical device comprising a current collector capped by an electrochemically active layer. The different layers formed define three-dimensional patterns. For example, the apex and the lateral surfaces are in intimate contact with the electrolyte before and after polymerisation thereby enhancing the electrical performances by increasing the contact surface between the electrolyte 1 and electrode 2a.

An electrolyte in liquid form is an electrolyte that is able to flow, that presents a weak cohesion between its molecules and that is easily deformable.

An electrolyte in the form of a gel is an electrolyte that does not flow but that remains deformable.

An electrolyte in solid form is an electrolyte that does not flow and that cannot deform without breaking. It presents a strong cohesion between its molecules.

Transformation by polymerisation into a more rigid electrolyte, for example a solid electrolyte or an electrolyte in gel form, can be achieved in different ways.

It is advantageous to use an electromagnetic radiation to transform the electrolyte 1 into a more rigid electrolyte. This in fact avoids having to heat the electrochemical device which could result in damage to certain of its constituent elements. This also prevents formation of an electrochemical device that is permeable to the solvent, as this embodiment can be complicated to implement as far as the choice of materials is concerned.

The electrolyte 1 is configured to be an electronic insulator and preferentially an ionic conductor in its solid or gel form. The electrolyte is advantageously configured to be an electronic insulator and preferentially an ionic conductor in its liquid form.

The electrolyte 1 is advantageously formed by a polymer or inorganic matrix that provides its structural properties and by a liquid that provides its electrical and electrochemical properties.

In advantageous manner, the matrix is formed by a porous material. The pores of the matrix are filled with a liquid solution comprising at least one salt of the ion to be transported between the electrodes. The ion used can for example be lithium or sodium depending on the type of battery required. As a variant, it is also possible to provide for the ion to be able to be chosen from potassium, silver, copper, magnesium and aluminium.

As an alternative or in association, the electrolyte 1 is formed by mixing the different components. When the polymerisation step is performed, the ionic liquid and/or the salt of the ion are entrapped.

The electrolyte advantageously contains a matrix and for example a polymer matrix that can be formed by a material chosen from polyethylene glycol (PEG), bisphenol A ethoxylate dimethacrylate (BEMA), polyethylene glycol diacrylate, methyl methacrylate, polyvinylidene fluoride (PVDF), polymethyl methacrylate (PMMA), polyacrylonitrile (PAN), or polyvinylidene fluoride-hexafluoropropylene (PVDF-HFP, polyvinylidene fluoride-co-hexafluoropropylene)).

To form the matrix, it is further possible to use a polyionic liquid. For example, it is advantageous to use (poly(N-vinylimidazolium) bis(trifluoromethanesulphonylimide)).

It is further possible to use an inorganic matrix of silica type which is advantageously chosen from tetraethyl orthosilicate (TEOS), methyl trimethoxysilane (NTMS), tetramethyl orthosilicate (TMOS), vinyl triethoxysilane (TEVOS) or a mixture of the latter.

The electrolyte 1 can also contain a solvent and advantageously a carbonate solvent and more advantageously a solvent chosen from ethylene carbonate (EC), propylene carbonate (PC), diethyl carbonate (DEC), dimethyl carbonate (DMC), succinonitrile (SN) glutaronitrile (GN), or vinyl carbonate (VC). The electrolyte 1 can also contain a mixture of several of the aforesaid solvents.

The electrolyte 1 can also contain an ionic liquid which is preferentially chosen from ionic liquids in the family of piperidinium, imidazolium, pyrrolidinium and pyridinium anions or ammonium anions. These ionic liquids are advantageously associated with at least one of the cations of $CH_3COO-$ acetate, bis(trifluoromethanesulphonyl)imide TFSI—, bis(fluorosulphonyl)imide FSI—, bis(oxalate)borate $B(O4C2)2-$, bromide Br—, chloride Cl—, iodide I—, tetrachloroaluminate Cl—, $AlCl_2$, hexafluorophosphate $PF_6-$, tetrafluoroborate $BF_4-$, dicyanamide $N(CN)_2-$, ethylphosphonate $(C_2H_5O)(H)PO_2-$, methylphosphonate $(CH_3O)(H)PO_2-$, hydrogen sulphate $H5O4-$, methanesulphonate $CH_3SO_3-$, and/or trifluoromethanesulphonate $CF_3SO_3-$. The electrolyte 1 can also contain a mixture of several of the aforesaid ionic liquids with one or more of the aforesaid cations.

As a variant, it is further possible to form an electrolyte 1 that contains at least one of the aforesaid solvents and at least one of the aforesaid ionic liquids.

It is advantageous to use an ionic liquid chosen from PYR13TFSI or N-propyl-N-methylpyrrolidinium bis(trifluoromethanesulphonyl)imide, PYR14TFSI or 1-butyl-1-methylpyrrolidinium bis(trifluoromethanesulphonyl)imide, EMITFSI or 1-ethyl-3-methylimidazolium-bis (trifluoromethyl-sulphonyl)imide, BMITFSI or 1-butyl-3-methylimidazolium bis(trifluoromethylsulphonyl)imide and EMIPFSI or 1-ethyl-3-methylimidazolium bis(perfluoroethylsulphonyl) imide.

As a variant, it is further possible to form an electrolyte 1 that contains at least one of the aforesaid solvents and at least one of the aforesaid ionic liquids.

To form a lithium battery, the electrolyte 1 advantageously contains a lithium salt chosen from lithium chloride (LiCl), lithium bromide (LiBr), lithium iodide (LiI), lithium perchlorate (LiClO$_4$), lithium hexafluorophosphate (LiPF$_6$), lithium bis(fluorosulphonyl)imide (LiFSI), lithium tetrafluoroborate (LiBF$_4$), lithium hexafluoro arsenate (LiAsF$_6$), lithium trifluoromethanesulphonate (LiCF3SO3), lithium bis(trifluoromethanesulphonyl)imide (LiTFSI), lithium bis (trifluoromethanesulphonyl)imide (LiN(CF3SO2)2), or a mixture of several of these salts.

In the same way, to form a sodium battery, the electrolyte 1 contains a sodium salt. It is further possible to provide for the battery or the electrochrome device to comprise a salt of another of the aforesaid ions.

To perform polymerisation by means of an electromagnetic radiation and more particularly by means of an ultraviolet radiation, it is advantageous to add a photoinitiator to the electrolyte 1. The photoinitiator is advantageously chosen from 2-hydroxy-2-methyl-1-1-phenylpopane-1-one (marketed under the tradename Darocur™ 1173 or HMPP), azobisisobutyronitrile (AIBN), 2-2-dimethoxy-2-phenylacetophenone (DMPA), benzophenone (BP), or p-xylene-bis (n,n-diethyl dithiocarbonate) (XDT).

By judiciously choosing the constituents of the electrolyte 1 and in particular the photoinitiator, the radiation wavelength enabling the electrolyte 1 to be polymerised can be defined.

For example purposes, an electrolyte 1 containing a polymer matrix of BEMA type and a photoinitiator of HMPP type is reactive to a wavelength equal to 365 nm. It is advantageous to use a radiation power comprised between 3 and 40 mW/cm$^2$ and a dose that can vary between 0.2 and 0.5 mWh/cm$^2$ to perform polymerisation. The person skilled in the art should bear in mind that the dose and exposure power can vary in order to take account of the required physico-chemical parameters and in particular to obtain specific mechanical, electrochemical and chemical properties.

In one embodiment, the polymerisation step is a step of at least partial polymerisation of the electrolyte 1 by exposure of the electrolyte 1 by means of a first electromagnetic radiation through the first and/or second electrodes 2a/2b. The device is subjected to a polymerisation step of the electrolyte 1. The electrolyte 1 will therefore react so as to be at least partially transformed into a more rigid electrolyte, for example a solid electrolyte or an electrolyte in gel form.

As illustrated in FIGS. 1 to 5, the first stack is subjected to a polymerisation step of the electrolyte 1 that is configured to form a first area 1α and a second area 1β. The first area 1α is distinct from the second area 1β. The electrolyte 1 will react so as to be at least partially transformed into a more rigid electrolyte, for example a solid electrolyte. The difference of rigidity can result in an increase of the Young's modulus.

Depending on the embodiments, the polymerisation step is performed before the second electrode 2b is in contact with the electrolyte 1. As an alternative, the first and second electrodes 2a and 2b are in contact with the electrolyte 1 during the polymerisation step.

In a preferential embodiment, the electromagnetic radiation source emits a first electromagnetic radiation power to form the first area 1α and second area 1β.

Before the polymerisation step, the electrolyte 1 is formed by a first mixture containing monomers and/or pre-polymers. After the polymerisation step, the electrolyte is formed by the first mixture in which the monomers and/or pre-polymers have reacted to form polymers. The chemical composition is therefore the same with the exception of the polymerisation reaction of the monomers and/or pre-polymers. The composition is the same in the first area 1α and the second area 1β with the exception of the polymerisation reaction of the monomers which is different.

The first area 1α is formed by a material having a first degree of cross-linking and/or a first cross-linking density. The second area 1β is formed by a material having a second degree of cross-linking and/or a second cross-linking density. The second degree of cross-linking is different from the first degree of cross-linking and/or the second cross-linking density is different from the first cross-linking density.

The two areas 1α/1β are formed by the same material which is at different levels of the polymerisation reaction or in different cross-linking states. These cross-linking differences result in differences in the electrochemical properties and in particular in differences of ionic conductivity. This difference of degree of cross-linking also results in differences in the mechanical properties. In advantageous manner, the first and second areas present degrees of cross-linking and/or cross-linking densities that are different from the initial degree of cross-linking and/or the initial cross-linking density.

The cross-linking density represents the number of bridges that are present in the polymer network, this corresponding to the number of bonds per pattern constituting the polymer material. The degree of cross-linking corresponds to the degree of progress of the reaction also called conversion rate and it represents the ratio between the number of species that have reacted and the initial number of species available for cross-linking.

Depending on the embodiments, before the polymerisation step, the electrolyte 1 can be in liquid form or in gel form. After polymerisation, the electrolyte can be in solid form or it can be used in the form of a gel. The electrolyte is formed by a polymer or inorganic matrix that gives it its structural properties and by an active material for example in the form of a gel or in solid form that gives it its electrical and electrochemical properties.

The polymerisation step is a step of at least partial polymerisation of the electrolyte so as to form the first area 1α and second area 1β.

The polymerisation step is advantageously a polymerisation step by exposure with at least one electromagnetic radiation. The use of polymerisation by exposure is particularly advantageous as it enables the outlines of the first and second areas 1α/1β in the electrolyte layer 1 to be defined precisely and easily.

Figure 18:
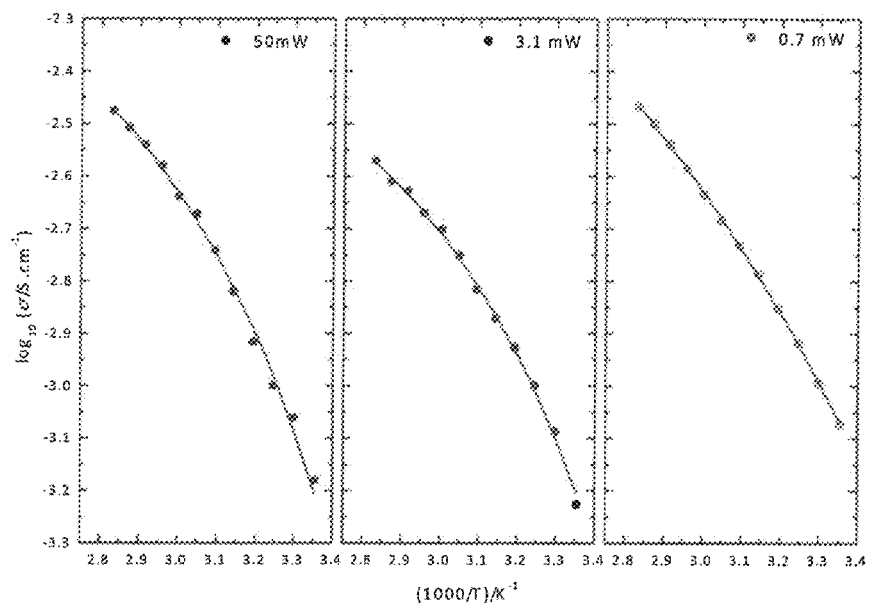
FIGS. 18 and 19 illustrate the variations of the ionic conductivity and of the mechanical performances versus the exposure power for an electrolyte having a degree of cross-linking equal to 100%.

FIG. 18 illustrates the influence of the exposure power on the ionic conductivity of the electrolyte. It can be observed that using two different powers enables two electrolytes with different ionic conductivities to be obtained. The degree of cross-linking is identical for all three samples and equal to 100%. These results are obtained by electrochemical impedance spectrometry. The electrolyte contains a polymer, in this case BEMA, an ionic liquid, Pyr13TFSI, and a lithium salt, LiTFSI. The electrolyte contains 30% by wt. of polymer and 70% by wt. of the mixture formed by the ionic liquid and the lithium salt. The concentration of LiTFSI in the Pyr13TFSI/LiTFSI mixture is equal to 0.231 molar, i.e. 0.231 mol/L. The electrolyte also contains a photoinitiator which is here Darocur 1173 marketed by the Ciba company.

Figure 19:
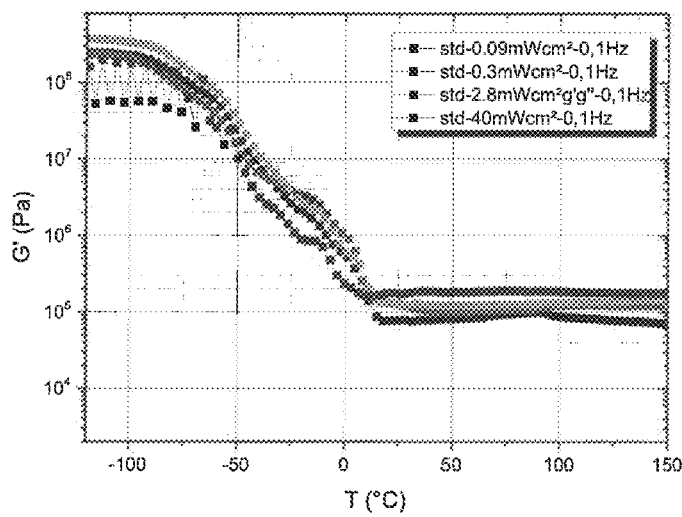

FIG. 19 illustrates the influence of the exposure power on the mechanical behaviour of the electrolyte and more particularly on the value of the rubbery plateau. These results are obtained by dynamic mechanical analysis DMA. It is apparent that the samples subjected to the highest powers present a higher complex Coulomb modulus which is representative of a greater rigidity. The electrolyte is identical to that presented in FIG. 18.

In advantageous manner, the first and second areas $1\alpha/1\beta$ both connect the first main surface of the electrolyte layer 1 with the opposite other main surface of the electrolyte layer 1. One of the main surfaces is in contact with the first electrode 2a. In this way, the electrolyte layer 1 defines privileged flow channels of the ions between the two main surfaces and therefore between the two electrodes 2a and 2b.

In a first embodiment, in the course of the polymerisation step, the whole of the electrolyte volume 1 is transformed, i.e. the whole of the electrolyte volume changes state. It is advantageous to transform a liquid electrolyte into a solid electrolyte in order to eliminate risks of leakage. It is also advantageous to transform a part of the liquid electrolyte into an electrolyte in gel form to reduce the risks of leakage and to facilitate insertion of the second electrode 2b. The other part of the electrolyte is in the form of a solid or a gel.

The radiation used advantageously enables the liquid electrolyte 1 to be polymerised and the interface between the first electrode 2a and the liquid electrolyte 1 to be replaced by an interface between the first electrode 2a and the solid electrolyte or the electrode in gel form.

In another embodiment, the polymerisation step is an at least partial polymerisation step of the electrolyte 1 by exposure of the electrolyte 1 by means of a first electromagnetic radiation. Only a part of the volume of the electrolyte 1 is transformed. Electrolyte channels connect the two electrodes to enhance the ionic performances and other channels in the form of a gel or a solid connect the two electrodes to provide a mechanical support.

In an advantageous embodiment illustrated in FIGS. 1 to 17, the exposure step is configured to apply different exposure conditions, i.e. two different radiation powers and/or two different doses on two different areas of the electrolyte 1. These two different exposure conditions will result in two different polymerisation reactions on the electrolyte 1 which will form a first area $1\alpha$ and a second area $1\beta$ which presents different cross-linking characteristics. These cross-linking differences are expressed by differences of mechanical behaviour and of ionic conductivity. The structure of the polymer is different between the first area $1\alpha$ and second area $1\beta$.

Figure 2:
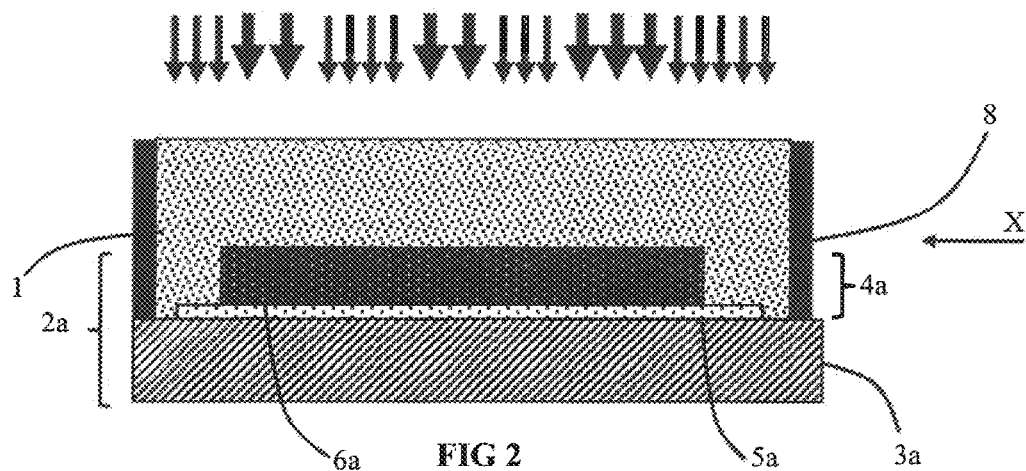

In a first embodiment illustrated in FIGS. 1 and 2, the incident radiation is a variable-power radiation and is provided by an electromagnetic radiation source that is configured to simultaneously emit different first and second powers in the direction of two areas of the first stack. These power differences enable the electrolyte 1 to be cross-linked and to form the first area $1\alpha$ and/or second area $1\beta$ in gel form or in solid form. In the embodiment of FIG. 1, the radiation source defines exposed areas and unexposed areas. In the unexposed area, the electrolyte remains in its initial state. In the embodiment of FIG. 2, the radiation source defines areas exposed by a first power and areas exposed by a second power different from the first power.

In a particular embodiment, the electromagnetic radiation source can be formed by first and second elementary sources which emit the same power or different powers. The electromagnetic radiation source advantageously emits the same power in the direction of the different parts of the first stack and the electromagnetic radiation is absorbed to define the first and second areas $1\alpha/1\beta$ with different degrees of cross-linking.

In a second embodiment which can be combined with the previous embodiment, it is possible to use a mask presenting at least two regions which have different transmission rates of the electromagnetic radiation. These differences in transmission rate are used to form the first and second areas $1\alpha$ and $1\beta$ of the electrolyte 1. This embodiment is particularly advantageous as it enables the shape of the areas to be modified quickly by changing only the shape of the first and second regions of the mask. In advantageous manner, the transmission rate is comprised between 1% and 100% of transmission. The first and second areas $1\alpha/1\beta$ made from electrolyte are defined by the shape of the first and second regions in relation with the direction of the incident radiation through the mask.

Figure 3:
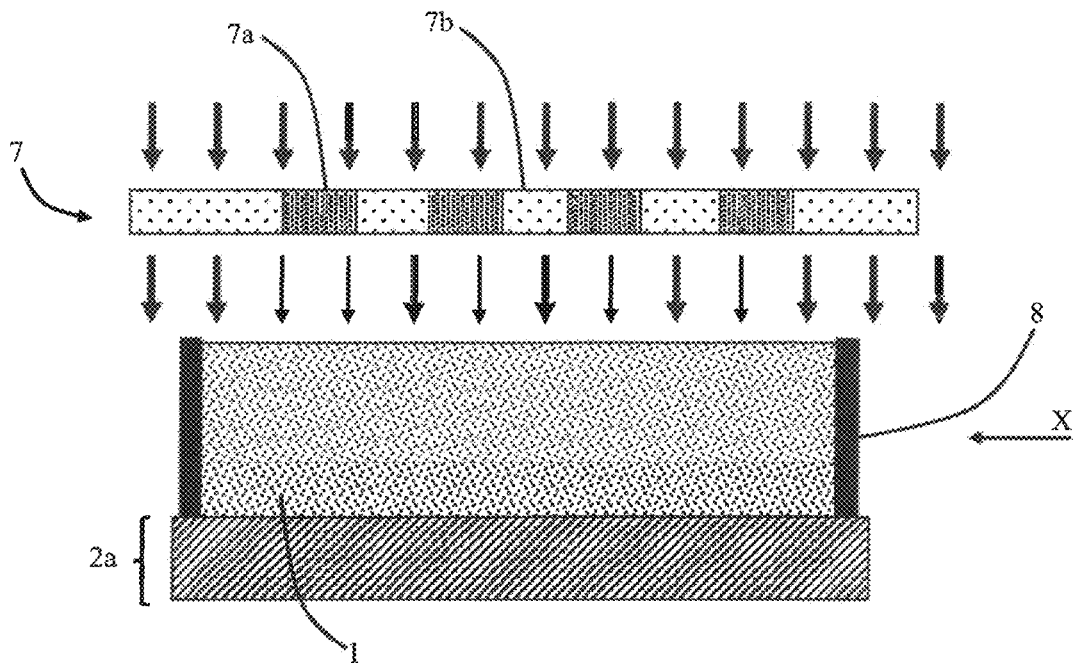
Figure 4:
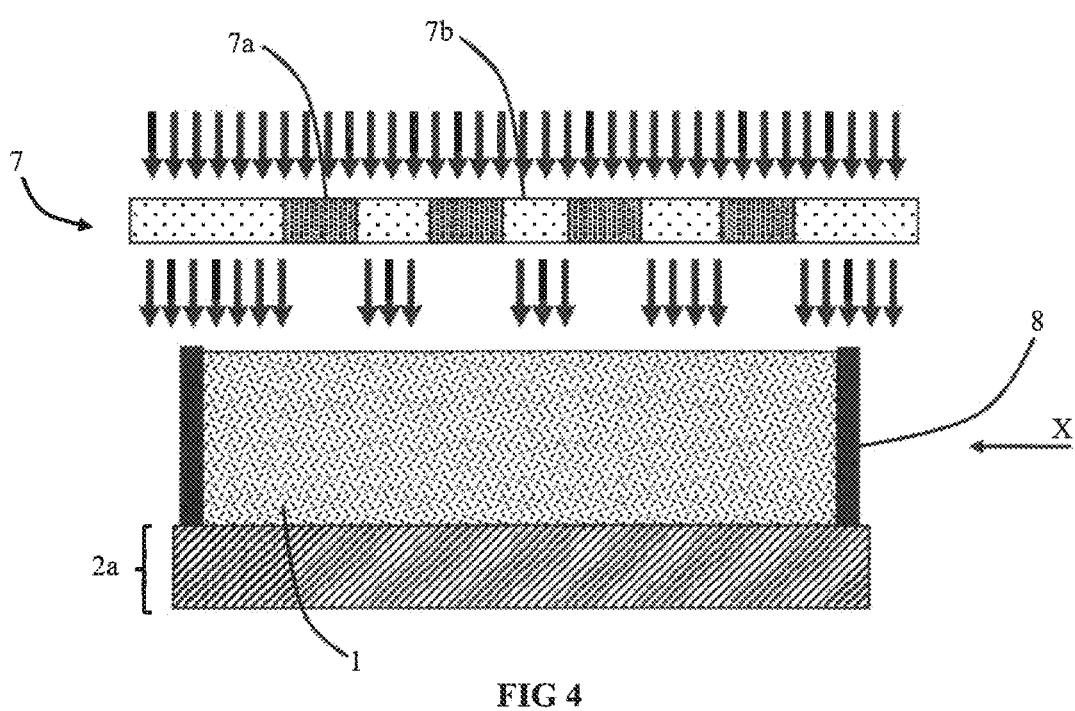

In a first specific case illustrated in FIGS. 3 and 4, the mask is an outer mask 7 that is distinct from the first electrode 2a and more preferentially from the electrochemical device. The mask 7 is used to form the first area $1\alpha$ and second area $1\beta$. FIG. 3 illustrates two regions 7a and 7b with different transmission rates and FIG. 4 illustrates a particular case with opaque regions and transparent regions.

Figure 5:
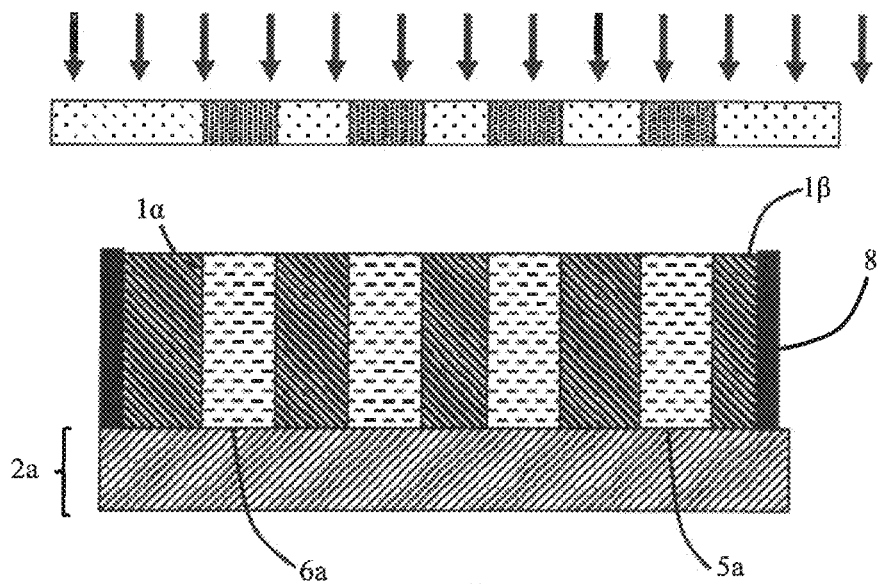

FIG. 5 illustrates formation of the first area $1\alpha$ and of the second area $1\beta$ in the electrolyte 1 after the polymerisation step.

Figure 6:
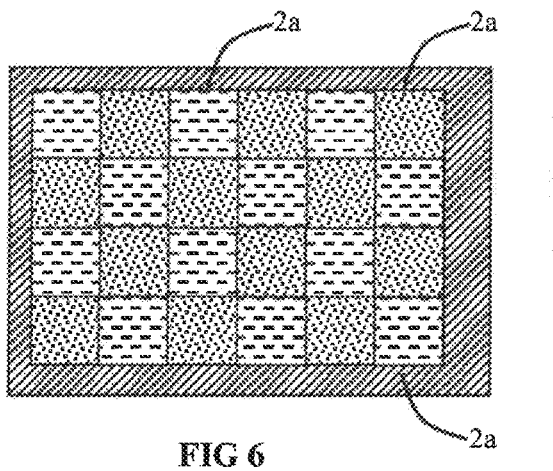
FIGS. 6, 7 and 8 represent, in schematic manner, different organisations of the first and second areas of the electrolyte on the first electrode, in top view.

In the embodiment illustrated in FIG. 6, the mask 7 is configured to define a chequered pattern of first areas $1\alpha$ and second areas $1\beta$.

Figure 7:
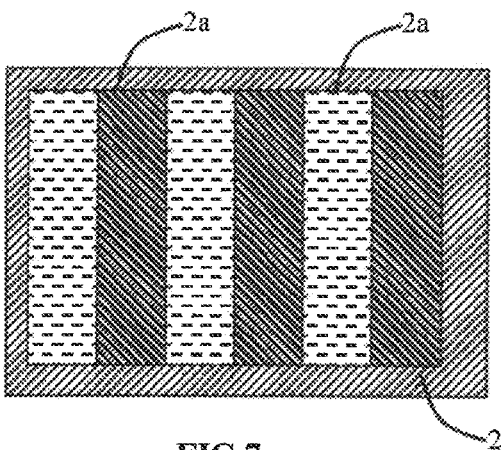

In the embodiment illustrated in FIG. 7, the mask 7 is configured to define an alternation of strips of first areas $1\alpha$ and second areas $1\beta$. The alternation is observed in a direction parallel to the first main surface of the electrolyte 1. The first and second areas are oriented perpendicularly to the first main surface to connect the two opposite main surfaces of the electrolyte.

Figure 8:
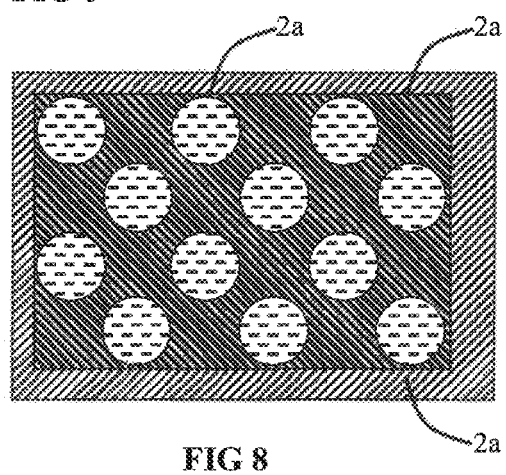

In the embodiment illustrated in FIG. 8, the mask 7 is configured to define a plurality of first areas $1\alpha$ in the form of pillars inside a second area $1\beta$ acting as a matrix. In the illustrated example, the pillars present a circular cross-section, but it is also possible to form pillars having a cross-section that is square, rectangular or of any other shape.

As an alternative, it is also possible to invert the first area $1\alpha$ and second area $1\beta$.

It is further possible to provide a mask enabling a combination of the different embodiments to be defined.

In a second specific case illustrated in FIGS. 9 to 15, the mask is an inner mask which forms part of the first stack. The mask can be formed in the first electrode 2a. The mask is used to form the first area $1\alpha$ and second area $1\beta$. It is particularly advantageous to form the mask in the first electrode 2a as the first and second areas $1\alpha$ and $1\beta$ are self-aligned with respect to the patterns of the electrode 2a thereby facilitating location of areas with enhanced mechanical performances and areas with enhanced ionic performances. The inner mask can define the same patterns in the first and second areas $1\alpha$ and $1\beta$ as the outer mask 7 (FIGS. 6 to 8).

In a third embodiment which can be combined with the previous embodiments, it is possible to use different exposure times to form the first area $1\alpha$ and second area $1\beta$. As an alternative, the exposure time to the electromagnetic radiation is identical to form the first and second areas $1\alpha/1\beta$.

To modify the exposure time, it is possible to use an inner or outer mask presenting at least two regions. After a predetermined time, one of the regions blocks the electromagnetic radiation whereas the other region lets the electromagnetic radiation pass. It is also possible to use a radiation source which is configured to no longer emit in a predefined region after a predefined time.

In a particular embodiment which can be combined with the previous embodiments, the polymerisation step is configured so as not to expose the first area $1\alpha$ and to expose the second area $1\beta$ of the electrolyte. Cross-linking will take place in the second area $1\beta$ and not in the first area $1\alpha$. An opposite configuration is possible.

In an embodiment that can be illustrated in FIGS. 4 and 9 to 15, the mask is partially transparent to the electromagnetic radiation, i.e. it has regions that are opaque and regions that are transparent to the electromagnetic radiation. In one particular case, all the transparent regions have the same transmission rate. In an alternative, several different transmission rates can be present among the different transparent regions.

In an alternative embodiment, the polymerisation step is configured to expose the first area $1\alpha$ and to expose the second area $1\beta$ of the electrolyte simultaneously. Cross-linking will take place in the second area $1\beta$ and in the first area $1\alpha$. The exposure conditions of the first area $1\alpha$ are different from the exposure conditions of the second area $1\beta$ in particular on account of the differences of transmission rates and/or exposure times.

In another embodiment that can also be illustrated in FIGS. 3 and 9 to 15, the mask is transparent to the electromagnetic radiation, i.e. it has at least first and second regions transparent to the electromagnetic radiation. These first and second transparent regions present different transmission rates.

In a particular embodiment illustrated in FIGS. 3 to 5 and 9 to 15, the mask presents an alternation of first regions and second regions in a direction X parallel to the first main surface of the electrolyte and/or of the first electrode 2a and/or of the second electrode 2b.

In an embodiment illustrated in FIGS. 9 to 15, the central region of the mask presents a lower transmission rate than the peripheral region as it is thicker and/or it is formed from a more absorbent material. For example, the central region is opaque.

The exposure step defines the first area $1\alpha$ and the second area $1\beta$. In advantageous manner, the second area $1\beta$ completely surrounds the first area $1\alpha$ in a cutting plane parallel to the first main surface of the electrolyte 1. In this way, if the first area $1\alpha$ is liquid, the risks of leakage of the liquid electrolyte are reduced without the electrochemical performances of the device being impaired.

A configuration with opaque regions and transparent regions can be used to partially transform the liquid electrolyte 1 into a solid electrolyte. The device then comprises a bi-phase electrolyte. The portion of liquid electrolyte 1 transformed into solid or gel electrolyte enables the risks of leakage of the liquid electrolyte 1 to be reduced. Areas of liquid electrolyte are kept to enhance the ionic performances of the electrolyte 1.

In one embodiment, the polymerisation step is configured to partially form a solid electrolyte. This solid electrolyte forms an additional cover completely separating the liquid electrolyte 1 and first electrode 2a. In this way, an additional material separates the liquid electrolyte 1 from the outside of the device thereby reducing the risks of leakage.

It is advantageous to provide for a solid electrolyte to be polymerised on the peripheral areas in contact with the first electrode 2a and with the future second electrode 2b thereby enabling risks of leakage of a liquid electrolyte 1 to be reduced.

As indicated in the foregoing, the different alternative embodiments can be used either alone or in combination to form the first and second areas $1\alpha$ and $1\beta$. It is possible to use an outer mask either on its own or in association with an inner mask and possibly a radiation source delivering different powers simultaneously. It is further possible to use an inner mask either on its own or in association with an outer mask and possibly a radiation source delivering different powers simultaneously. It is further possible to use a radiation source delivering different powers simultaneously either on its own or in association with an outer mask and/or an inner mask.

In a particular embodiment, the differences of optical properties of the first electrode 2a are defined by fabricating a first electrode which uses different materials and/or different thicknesses of materials. The first and second regions of the mask are advantageously defined by means of the differences of thickness of the electrochemically active layer 6a and/or of the first current collector 5a.

In a first embodiment, the first electrode 2a is formed by a first support substrate 3a successively covered by a first current collector 5a and by a first electrochemically active layer 6a.

The electrochemically active layer 6a can present areas with different thicknesses in order to define first regions and second regions in the first electrode 2a. As a variant, the electrochemically active layer 6a can be etched so as to define covered areas and uncovered areas on the surface of the current collector 5a thereby defining first regions and second regions in the first electrode 2a and therefore in the inner mask. It is particularly advantageous to provide for the proportion of transparent areas to be less than 50% and preferentially less than 10%. Limiting the surface of the etched area of the electrochemically active layer 6a makes it possible to keep a large quantity of active material in operation of the battery or of the electrochrome device.

As an alternative, the current collector 5a can present areas with different thicknesses in order to define first regions and second regions in the mask formed in the first electrode 2a. As a variant, the current collector 5a can be etched so as to define covered areas and uncovered areas on the surface of the support substrate 3a thereby defining first regions and second regions in the first electrode 2a. The electrochemically active layer 6a comes into contact with the support substrate 3a in the areas not covered by the current collector 5a.

In an alternative embodiment, the electrochemically active layer 6a and current collector 5a both present areas with different thicknesses which enables first regions and second regions to be defined in the first electrode 2a. It is also possible to etch the stack formed by the electrochemically active layer 6a and current collector 5a so as to define covered areas and uncovered areas on the surface of the support substrate 3a thereby defining first regions and second regions in the first electrode 2a. The electrolyte 1 comes into contact with the support substrate 3a in the areas not covered by the electrochemically active layer 6a and not covered by the current collector 5a.

In the embodiment illustrated in FIGS. 12 to 15, the electrochemically active layer 6a and the current collector 5a both define holes so as to allow the incident radiation to pass and so that all the areas of the current collector 5a are connected to one another and at the same potential.

In a particularly advantageous manner, it is advantageous to provide for the polymerisation step to comprise a single exposure step configured to form the first and second areas 1α/1β. The single polymerisation step enables the first and second areas 1α/1β to be defined quickly and easily in the electrolyte layer. At the end of the polymerisation step, the first and second areas 1α/1β are present in the electrolyte layer with different first and second degrees of cross-linking. This embodiment is obtained for example by use of an exposure mask presenting areas with different transmission rates.

In a particular embodiment, the electromagnetic radiation dose received by the first area 1α is different from the electromagnetic radiation dose received by the second area 1β. The difference of dose can arise from a difference in the exposure operating conditions, for example a difference of exposure power between the first and second areas 1α/1β and/or a difference of exposure time between the first and second areas 1α/1β enabling two different degrees of cross-linking and/or cross-linking densities to be obtained.

This polymerisation step can be performed before the second electrode 2b is placed in contact with the electrolyte 1.

The electrolyte 1 is arranged on the first electrode 2a. Depending on its viscosity, the electrolyte 1 can be located by means of a blocker 8, here in the form of a ring, which is in contact with the first electrode 2a so as to define a reservoir which is filled by the electrolyte 1. In particularly advantageous manner, the reservoir is completely filled by the electrolyte 1. The electrolyte 1 is in contact with the first electrode 2a. The blocker 8, in the form of a ring, advantageously defines a sealed enclosure operating in conjunction with the first electrode 2a and with the second electrode 2b after the second electrode 2b has been transferred.

If the electrolyte 1 is viscous, the blocker 8 surrounding the electrolyte is advantageous but it may not be used. As a variant, the blocker 8 can be replaced by multiple non-contiguous side walls which limit flow of the electrolyte 1 from the area involved until polymerisation of the electrolyte has been completed. Once polymerisation has been completed, the blocker 8 can be removed. As an alternative, the blocker 8 can be kept if it enables ingress of pollutants or harmful molecules, for example oxygen and/or water, to be blocked or delayed.

In an advantageous embodiment, spacers (not shown) are arranged on the first electrode 2a. These spacers enable the minimum distance separating the two electrodes 2a and 2b in the electrochemical device to be defined. It is advantageous to use spacers to act as blocker 8 and to locate the electrolyte 1 at the surface of the electrodes 2a and 2b.

In advantageous manner, the spacer is configured so that the minimum distance between the first electrode 2a and second electrode 2b is less than 500 microns. In a particular embodiment where the electrochemical device is a battery or an electrochrome device, the spacer is configured so that the distance between the two electrochemically active layers 6a and 6b is less than 50 microns. This precaution prevents short-circuiting between the two electrodes 2a and 2b while at the same time ensuring that a small distance is obtained between the electrodes thereby ensuring a low inner electrical resistance.

In a particular embodiment, the differences of optical properties of the first electrode 2a are obtained by fabricating a first electrode 2a that uses different materials and/or different thicknesses of materials to define the first region and the second region of the inner mask.

Figure 9:
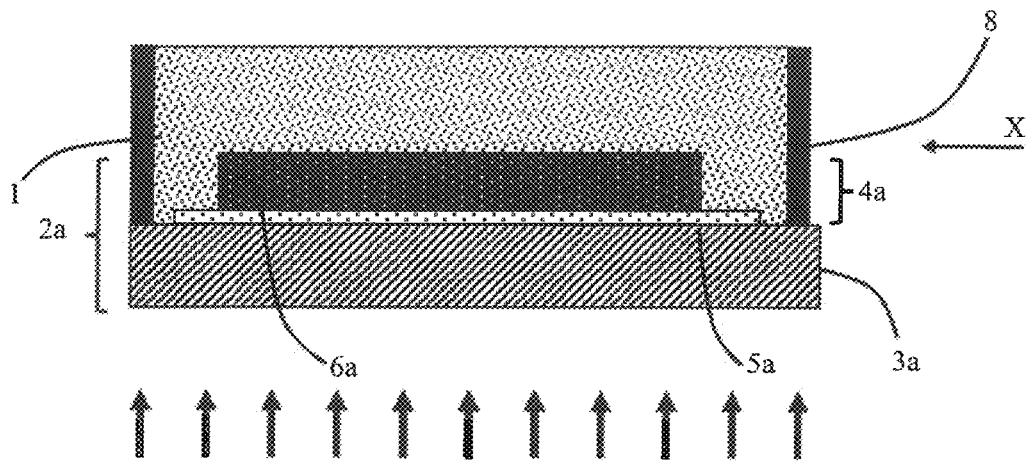
FIGS. 9, 10 and 11 represent, in schematic manner, another alternative embodiment of a method for fabricating an electrochemical device, in cross-section.
Figure 10:
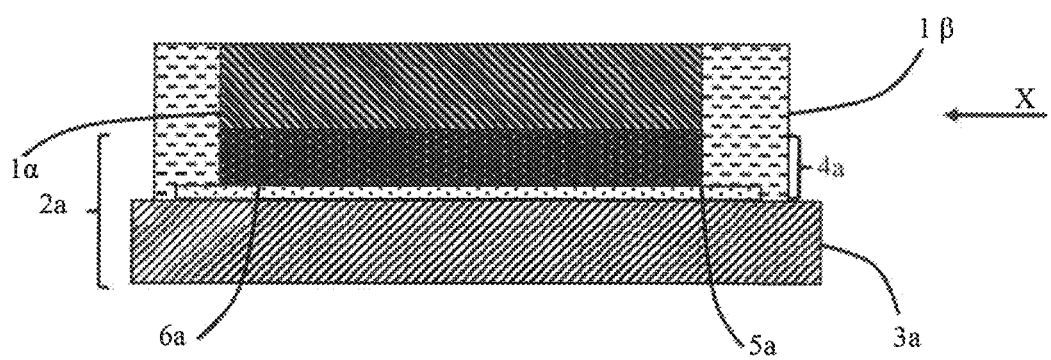

In the embodiment illustrated in FIG. 9, the central region of the first electrode 2a is thicker and forms a more absorbent and therefore less transmissive region. The exposure step therefore defines a first area 1α with first cross-linking characteristics in the extension of the central area and a second area 1β with second cross-linking characteristics around this central area. In advantageous manner, the second area 1β completely surrounds the first area 1α.

Although all the embodiments suggest a uniform power of the radiation source, it is possible to use all these embodiments with a radiation source delivering at least two different powers simultaneously for two different regions of the electrochemical device.

All the embodiments are also presented with a radiation that presents a single propagation direction, i.e. a single angle with respect to the surface of the electrochemical device or of the first stack. As a variant, it is advantageous to use different exposure conditions and in particular exposure conditions with different angles (between the incident radiation and at the surface of the electrode 2a) in order to form first and/or second areas 1α/1β of complex shape connecting the first electrode 2a with the second electrode 2b. This also enables the volume of one of the two areas to be reduced with respect to the mask which is defined by the first electrode 2a.

The electrochemical device can be produced in different ways. A first advantageous embodiment can be obtained by breaking the electrochemical device down into two different stacks and by subsequently associating these two different stacks.

In a particular embodiment, it is particularly advantageous to produce a first stack comprising the first electrode 2a independently from a second stack comprising the second electrode 2b. These two stacks are then assembled to form the electrochemical device.

The first stack can be formed simply in the following manner. The first electrode 2a is provided and the electrolyte 1 is deposited on the first electrode 2a. If necessary the blocker 8 can be used to confine the electrolyte 1.

The second stack can be formed simply, in the following manner, by providing the second electrode 2b.

The polymerisation step is performed before the second electrode 2b is placed in contact with the electrolyte 1.

The second electrode 2b is placed in contact with the liquid electrolyte 1 which separates the two electrodes 2a and 2b. The electrochemical device is formed.

This embodiment can be used to form a complex device such as a battery or an electrochrome device. The first electrode 2a is for example formed by providing a support substrate 3a on which a first current collector 5a is formed. It is then possible to form a first electrochemically active layer 6a on the first current collector 5a.

When contact is made, the first area 1α connects the first electrochemically active layer 6a with the second electrochemically active layer 6b. The second area 1β connects the first current collector 5a with the second current collector 5b and/or the first support substrate 3a with the second support substrate 3b. It is particularly advantageous to provide for the first area 1α to have a higher ionic conductivity than that of the second area 1β. It is also advantageous to provide for the second area 1β to have better mechanical performances than those of the first area 1α.

Depending on the embodiments, the different layers forming the first electrode can be deposited full wafer and then etched. As an alternative, the different layers can be formed through a mask so as to define the desired patterns directly. It is also possible to combine these two techniques according to the layers to be deposited. As previously, once the first electrode has been formed, the liquid electrolyte 1 can be deposited. In this particular case, the electrolyte is deposited in contact with the electrochemically active layer. Here again, a blocker 8 can be used.

The second electrode 2b can be formed in similar manner to the first electrode 2a. The second electrode 2b and more particularly the second electrochemically active layer 6b is placed in contact with the liquid electrolyte 1.

If a part of the electrolyte is preserved in liquid form, the latter can then infiltrate easily into the anfractuosities of the material forming the electrode which is not the case with a solid electrolyte. This solution is particularly advantageous when fabricating a battery or an electrochrome device comprising a current collector 5a/5b capped by an electrochemically active layer 6a/6b.

FIGS. 16 and 17 illustrate another embodiment where the first and second electrodes are formed on the same support substrate 3. The two electrodes are formed before the polymerisation step. The materials used are advantageously identical to those presented in the foregoing embodiments. The polymerisation step is configured to form the first area 1α and second area 1β. In advantageous manner, the polymerisation step is configured to form a first polymerisation area 1α above the first electrode 2a and above the second electrode 2b. The first area 1α is situated above the electrodes along an axis perpendicular to a plane containing the first and second electrodes 2a and 2b. The polymerisation step is configured to form a second polymerisation area 1β between the first electrode 2a and second electrode 2b. In preferential manner, the second area 1β presents a better ionic conductivity than the first area 1α thereby improving transit of the ions between the two electrodes 2a and 2b. The mechanical strength of the electrochemical device is provided by the first areas 1α.

In an even more advantageous embodiment, the space situated between the first and second electrodes 2a and 2b comprises second and third polymerisation areas 1β and 1Ω. The third area 1Ω presents a third degree of cross-linking that is different from the first degree of cross-linking and/or the second degree of cross-linking. The third area 1Ω presents a third cross-linking density that is different from the first cross-linking density and/or the second cross-linking density. The second and third areas 1β and 1Ω present different mechanical performances in order to avoid the electrochemical device being too greatly weakened between the two electrodes 2a and 2b. The second and third areas 1β and 1Ω preferably present a better ionic conduction than the first area 1α.

In an advantageous embodiment, the first, second and third areas are produced by means of a mask 7 comprising first, second and third regions 7a, 7b and 7c presenting different transmission rates.

In the embodiment illustrated in FIGS. 16 and 17, the electrolyte is encapsulated by a cover, for example by the second support substrate (not shown).

In advantageous manner, the difference in the degree of cross-linking between the first and second areas and/or the difference of cross-linking density between the first and second areas are configured so that the first and second areas present a structural inhomogeneity that is associated with a difference of mechanical behaviour and/or a difference of electrical behaviour, for example a difference of ionic conduction. For example, the difference of mechanical behaviour and/or the difference of electrical behaviour is at least equal to 5%, preferably at least equal to 10% and even more advantageously at least equal to 20%.

In the first polymerisation area and in the second polymerisation area, the mechanical characteristics (for example the Young's modulus) and the electrical characteristics (for example the electronic resistance and/or ionic conduction) are homogeneous. This homogeneity can be observed in the direction perpendicular to the first main surface of the electrolyte 1, i.e. in the direction used to perform polymerisation of the electrolyte 1.

In the direction parallel to the first main surface of the electrolyte 1 on the other hand, the mechanical and/or electrical characteristics are different, i.e. less homogeneous between a first area and an adjacent second area.

The invention claimed is:

1. Method for fabricating an electrochemical device comprising the following steps:
providing a first electrode,
providing a second electrode,
providing an electrolyte in contact with the first electrode, the electrolyte being electronically insulating and ionically conducting, and containing a polymer formed from a mixture containing monomers, pre-polymers thereof, or monomers and pre-polymers thereof, the electrolyte presenting an initial degree of cross-linking of the polymer and an initial cross-linking density of the polymer,
cross-linking the electrolyte so as to define at least one polymerisation area comprising a first polymerisation area presenting a first degree of cross-linking of the polymer and a first cross-linking density of the polymer and a second polymerisation area presenting a second degree of cross-linking of the polymer different from the first degree of cross-linking of the polymer or a second cross-linking density of the polymer different from the first cross-linking density of the polymer, the first and second degrees of cross-linking of the polymer being higher than the initial degree of cross-linking of the polymer and the first and second cross-linking densities of the polymer being higher than the initial cross-linking density of the polymer.

2. Method for fabricating the electrochemical device according to claim 1, wherein cross-linking the electrolyte defines an alternation of first polymerisation areas and second polymerisation areas in a direction parallel to a first main surface of the electrolyte, the main surface being in contact with the electrolyte.

3. Method for fabricating the electrochemical device according to claim 1, wherein at least one electromagnetic radiation is applied on the electrolyte to polymerise the electrolyte.

4. Method for fabricating the electrochemical device according to claim 3, wherein the at least one electromagnetic radiation is provided by an electromagnetic radiation source configured to emit a first electromagnetic radiation power to form the first polymerisation area and the second polymerisation area.

5. Method for fabricating the electrochemical device according to claim 3, wherein the at least one electromagnetic radiation is provided by an electromagnetic radiation source configured to simultaneously emit a first electromagnetic radiation power defining the first polymerisation area and a second electromagnetic radiation power different from the first power defining the second polymerisation area.

6. Method for fabricating the electrochemical device according to claim 3, comprising applying the at least one electromagnetic radiation through a mask, the mask defining at least two regions presenting different transmission rates at said at least one electromagnetic radiation to form said at least first and second polymerisation areas.

7. Method for fabricating the electrochemical device according to claim 6, wherein the at least two regions of the mask are configured to allow said at least one electromagnetic radiation to pass.

8. Method for fabricating the electrochemical device according to claim 4, comprising applying the at least one electromagnetic radiation in a single step to form said at least first and second polymerisation areas.

9. Method for fabricating the electrochemical device according to claim 4, wherein applying the at least one electromagnetic radiation is performed with a same exposure time to form said at least first and second polymerisation areas.

10. Method for fabricating the electrochemical device according to claim 4, wherein applying the at least one electromagnetic radiation is performed with a first exposure time to form the first polymerisation area and with a second exposure time different from the first exposure time to form the second polymerisation area.

11. Method for fabricating the electrochemical device according to claim 1, wherein, before cross-linking the electrolyte, the electrolyte is in liquid form and cross-linking the electrolyte is configured to form at least one of the first and second polymerisation areas in solid or gel form and to keep the other of the first and second polymerisation areas in liquid form.

12. Method for fabricating the electrochemical device according to claim 1, wherein, before cross-linking the electrolyte, the electrolyte is in liquid form and cross-linking the electrolyte is configured to form the first polymerisation area in solid or gel form and the second polymerisation area in solid or gel form.

13. Method for fabricating the electrochemical device according to claim 1, wherein the electrochemical device is a battery or an electrochrome device, wherein
the first electrode comprises:
    a first support substrate,
    a first current collector covering the first support substrate,
    a first electrochemically active layer in electric contact with the first current collector,
the electrolyte is in contact with the first electrochemically active layer and the second electrode comprises:
    a second electrochemically active layer separated from the first electrochemically active layer by the electrolyte,
    a second current collector in contact with the second electrochemically active layer, the second current collector being separated from the first current collector by the electrolyte,
    a second support substrate.

14. Method for fabricating the electrochemical device according to claim 1, wherein cross-linking the electrolyte is performed with ultraviolet radiation.

15. Method for fabricating the electrochemical device according to claim 1, wherein the second electrode is in contact with the electrolyte before cross-linking the electrolyte.

16. Method for fabricating the electrochemical device according to claim 1, wherein the second electrode is placed in contact with the electrolyte after cross-linking the electrolyte.

17. Electrochemical device comprising a first electrode and a second electrode separated by an electrically insulating electrolyte in solid form,
    wherein the electrolyte comprises a first polymerisation area presenting a first degree of cross-linking of a polymer and a first cross-linking density of the polymer and a second polymerisation area presenting a second degree of cross-linking of the polymer different from the first degree of cross-linking of the polymer or a second cross-linking density of the polymer different from the first cross-linking density of the polymer, the polymer of the first polymerisation area and the polymer of the second polymerisation area each being derived from the same initial polymer reactant, said first polymerisation area connecting the first electrode with the second electrode and said second polymerisation area connecting the first electrode with the second electrode.

* * * * *